United States Patent
Yoshimura et al.

(10) Patent No.: US 9,812,617 B2
(45) Date of Patent: Nov. 7, 2017

(54) LIGHT-EMITTING DEVICE AND IMAGE DISPLAY APPARATUS

(71) Applicant: Sharp Kabushiki Kaisha, Osaka-shi, Osaka (JP)

(72) Inventors: Kenichi Yoshimura, Osaka (JP); Tatsuya Ryohwa, Osaka (JP); Makoto Izumi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/156,431

(22) Filed: May 17, 2016

(65) Prior Publication Data

US 2016/0351757 A1   Dec. 1, 2016

(30) Foreign Application Priority Data

May 26, 2015  (JP) .................................. 2015-106655

(51) Int. Cl.
| | |
|---|---|
| H01L 33/00 | (2010.01) |
| H01L 33/50 | (2010.01) |
| H01L 33/56 | (2010.01) |
| H01L 33/44 | (2010.01) |

(52) U.S. Cl.
CPC ............ *H01L 33/504* (2013.01); *H01L 33/56* (2013.01); *H01L 33/44* (2013.01); *H01L 33/501* (2013.01); *H01L 33/502* (2013.01); *H01L 33/507* (2013.01)

(58) Field of Classification Search
CPC ...... H01L 33/504; H01L 33/507; H01L 33/56

USPC .................................................... 257/89, 102
See application file for complete search history.

(56) References Cited

U.S. PATENT DOCUMENTS

| | | | |
|---|---|---|---|
| 6,501,091 B1 | 12/2002 | Bawendi et al. | |
| 6,803,719 B1 | 10/2004 | Miller et al. | |
| 7,682,850 B2 * | 3/2010 | Harbers ............. | C09K 11/7774 257/98 |
| 2006/0169998 A1 | 8/2006 | Radkov et al. | |
| 2007/0205712 A1 | 9/2007 | Radkov et al. | |
| 2010/0091215 A1 | 4/2010 | Fukunaga et al. | |
| 2010/0103648 A1 * | 4/2010 | Kim ...................... | H01L 33/507 362/97.1 |
| 2010/0193806 A1 * | 8/2010 | Byun .................... | H01L 33/507 257/88 |
| 2011/0043101 A1 * | 2/2011 | Masuda ............. | C09K 11/0883 313/503 |
| 2011/0215348 A1 | 9/2011 | Trottier et al. | |
| 2013/0070443 A1 | 3/2013 | Pan et al. | |
| 2013/0264937 A1 | 10/2013 | Sakuta et al. | |

(Continued)

FOREIGN PATENT DOCUMENTS

| | | |
|---|---|---|
| JP | 2009-528429 A | 8/2009 |
| JP | 2010-93132 A | 4/2010 |

(Continued)

*Primary Examiner* — David Vu
*Assistant Examiner* — Brandon Fox
(74) *Attorney, Agent, or Firm* — Keating & Bennett, LLP

(57) ABSTRACT

A light-emitting device includes a light-emitting element configured to emit blue light, a first wavelength conversion member containing a $Mn^{4+}$-activated fluorine complex phosphor, and a second wavelength conversion member containing a quantum-dot phosphor, in which the first wavelength conversion member and the second wavelength conversion member are spatially separated from each other.

18 Claims, 12 Drawing Sheets

(56) References Cited

U.S. PATENT DOCUMENTS

| | | | |
|---|---|---|---|
| 2013/0294048 A1 | 11/2013 | Asano et al. | |
| 2016/0049560 A1* | 2/2016 | Oh | H01L 33/504 257/98 |
| 2016/0087162 A1* | 3/2016 | Yao | H01L 33/504 257/98 |
| 2016/0087164 A1 | 3/2016 | Kawano et al. | |
| 2016/0093776 A1* | 3/2016 | Setlur | C09K 11/617 257/98 |
| 2016/0097495 A1* | 4/2016 | Yamamoto | G02B 6/0073 349/65 |
| 2016/0268485 A1* | 9/2016 | Morimura | H01L 33/504 |

FOREIGN PATENT DOCUMENTS

| | | |
|---|---|---|
| JP | 2011-54958 A | 3/2011 |
| JP | 2011-142336 A | 7/2011 |
| JP | 2012-104814 | 5/2012 |
| JP | 2012-163936 A | 8/2012 |
| JP | 2013-14715 A | 1/2013 |
| JP | 2013-519232 A | 5/2013 |
| JP | 2013-534042 A | 8/2013 |
| JP | 2016-66664 A | 4/2016 |
| KR | 10-2012-0050286 | 5/2012 |
| WO | 2007/100824 A2 | 9/2007 |
| WO | 2009/110285 A1 | 9/2009 |

\* cited by examiner

FIG. 9

|  | TIME THAT AMOUNT OF LUMINOUS FLUX IS REDUCED TO 80% OR LESS OF INITIAL AMOUNT |
|---|---|
| EXAMPLE D1 | 100 HOURS |
| EXAMPLE D2 | 200 HOURS |
| EXAMPLE D3 | 500 HOURS OR MORE |
| COMPARATIVE EXAMPLE D1 | 1 HOUR |
| COMPARATIVE EXAMPLE D2 | 20 HOURS |

| Adobe RGB COVERAGE | IMAGE DISPLAY APPARATUS WHITE POINT | | | IMAGE DISPLAY APPARATUS RED POINT | | IMAGE DISPLAY APPARATUS GREEN POINT | | IMAGE DISPLAY APPARATUS BLUE POINT | |
|---|---|---|---|---|---|---|---|---|---|
| | COLOR TEMPERATURE (K) | CIEx | CIEy | CIEx | CIEy | CIEx | CIEy | CIEx | CIEy |
| 97.3% | 10011.5 | 0.281 | 0.288 | 0.678 | 0.296 | 0.220 | 0.719 | 0.154 | 0.067 |

LIGHT-EMITTING DEVICE AND IMAGE DISPLAY APPARATUS

BACKGROUND

1. Field

The present disclosure relates to a light-emitting device including a light-emitting element and a wavelength conversion member, and an image display apparatus including the light-emitting device.

2. Description of the Related Art

In recent years, light-emitting devices including combinations of (i) light-emitting elements, such as light emitting diodes (LEDs), and (ii) wavelength conversion members (for example, members containing phosphor particles dispersed in resins) that convert excitation light from the light-emitting elements into phosphorescence have been developed. Such light-emitting devices have small size and lower power consumption than those of incandescent lamps. Thus, such light-emitting devices have been practically used as light sources for various image display apparatuses and lighting equipment.

As such light-emitting devices, combinations of blue LEDs and yellow phosphors are commonly used. As yellow phosphors, Ce-activated yttrium-aluminum-garnet (YAG) phosphors are widely used because of its high luminous efficiency.

In the case where a light-emitting device is used as a backlight for an image display apparatus, the color reproduction range of the image display apparatus is broadened as the half width of an emission spectrum of a phosphor decreases. However, the emission spectrum of a Ce-activated YAG phosphor has a relatively large half width of about 100 nm. In the case where a semiconductor light-emitting device including the Ce-activated YAG phosphor serving as a yellow phosphor is used as a backlight for a liquid crystal in an image display apparatus, the color reproduction range is not sufficiently wide.

Specifically, the image display apparatus covers almost the entire range of the color gamut of sRGB, which is used for cathode-ray tubes (CRTs). However, the image display apparatus has low coverage of the Adobe RGB color gamut, which is used for wide-color-gamut liquid crystal displays.

More specifically, the color gamut of the image display apparatus including the semiconductor light-emitting device which contains the Ce-activated YAG yellow phosphor and which serves as a liquid crystal backlight has about 70% coverage of the Adobe RGB color gamut. Thus, the semiconductor light-emitting device is not suitably used for wide-color-gamut liquid crystal displays.

The color gamut of sRGB used here indicates a color gamut represented by a triangle defined by three chromaticity points: (CIEx, CIEy)=(0.640, 0.330), (0.300, 0.600), and (0.150, 0.060) on Commission Internationale de l'Eclairage (CIE) 1931 chromaticity coordinates.

Meanwhile, the color gamut of Adobe RGB indicates a color gamut represented by a triangle defined by three chromaticity points: (CIEx, CIEy)=(0.640, 0.330), (0.210, 0.710), and (0.150, 0.060) on the CIE 1931 chromaticity coordinates. A comparison between the color gamut of sRGB and the color gamut of Adobe RGB reveals that the color reproduction range of green in the color gamut of Adobe RGB is larger than that of sRGB.

A semiconductor light-emitting device used as a backlight for a wide-color-gamut liquid crystal display corresponding to the Adobe RGB color space may have a structure in which two phosphors, i.e., a green phosphor and a red phosphor, are used in combination. The half width of each of the phosphors may be narrow.

For example, International Publication No. 2009/110285 (publication date: Sep. 11, 2009) and Japanese Unexamined Patent Application Publication No. 2010-93132 (publication date: Apr. 22, 2010) each disclose a semiconductor light-emitting device including a combination of a Eu-activated $\beta$-SiAlON phosphor and a $Mn^{4+}$-activated fluoride complex. The combination enables an image display apparatus to have a wide color reproduction range, compared with a conventionally typical structure including a yellow phosphor.

This is attributed to the fact that both of the half width of the emission spectrum of the Eu-activated $\beta$-SiAlON phosphor and the half width of the emission spectrum of the $Mn^{4+}$-activated fluoride complex phosphor are smaller than that of the emission spectrum the Ce-activated YAG phosphor. Specifically, the half width of the emission spectrum of the Eu-activated $\beta$-SiAlON phosphor is 55 nm or less. The half width of the $Mn^{4+}$-activated fluoride complex phosphor is 10 nm or less.

As described above, the half width of the emission spectrum of the Eu-activated $\beta$-SiAlON phosphor is 55 nm or less and smaller than that of the emission spectrum of the Ce-activated YAG yellow phosphor. However, a combination with a phosphor having an emission spectrum with a smaller half width enables a wider-color-gamut image display apparatus.

Japanese Unexamined Patent Application Publication No. 2011-142336 (publication date: Jul. 21, 2011) discloses a structure in which two types of phosphors, i.e., a quantum-dot phosphor that emits green light and a quantum-dot phosphor that emits red light, are combined with a blue LED. However, in the structure described in Japanese Unexamined Patent Application Publication No. 2011-142336, the quantum-dot phosphor that emits red light absorbs green light emitted from the quantum-dot phosphor that emits green light to reduce the luminous efficiency of a light-emitting device.

Japanese Unexamined Patent Application Publication No. 2012-163936 (publication date: Aug. 30, 2012), Japanese Unexamined Patent Application Publication (Translation of PCT Application) No. 2013-519232 (publication date: May 23, 2013), and Japanese Unexamined Patent Application Publication (Translation of PCT Application) No. 2013-534042 (publication date: Aug. 29, 2013) each disclose a structure in which a quantum-dot phosphor and a $Mn^{4+}$-activated fluorine complex phosphor serving as phosphors dispersed in a wavelength conversion member are used in combination. Unlike the quantum-dot phosphor, the $Mn^{4+}$-activated fluorine complex phosphor does not absorb green light. Thus, the structure described in each of Japanese Unexamined Patent Application Publication No. 2012-163936, Japanese Unexamined Patent Application Publication (Translation of PCT Application) No. 2013-519232, and Japanese Unexamined Patent Application Publication (Translation of PCT Application) No. 2013-534042 may control the problem in which green light emitted from a phosphor that emits green light is absorbed by a phosphor that emits red light.

SUMMARY

However, the use of a quantum-dot phosphor and a $Mn^{4+}$-activated fluorine complex phosphor in combination in a light-emitting device causes a problem in which a fluorine product attributed to fluorine generated from a surface of the $Mn^{4+}$-activated fluorine complex phosphor attacks the quantum-dot phosphor to reduce the luminous efficiency. This problem is not disclosed in any of Japanese Unexamined Patent Application Publication No. 2012-163936, Japanese Unexamined Patent Application Publication (Translation of PCT Application) No. 2013-519232, and Japanese Unexamined Patent Application Publication (Translation of PCT Application) No. 2013-534042.

It is desirable to provide a light-emitting device configured to inhibit the degradation of the quantum-dot phosphor and an image display apparatus including the light-emitting device.

According to an aspect of the disclosure, there is provided a light-emitting device including a light-emitting element configured to emit blue light; a first wavelength conversion member containing a $Mn^{4+}$-activated fluorine complex phosphor that is excited by the blue light to emit red light; and a second wavelength conversion member containing a quantum-dot phosphor that is excited by the blue light to emit green light, in which the first wavelength conversion member and the second wavelength conversion member are spatially separated from each other.

BRIEF DESCRIPTION OF THE DRAWINGS

FIG. 9 is a table that lists the experimental results of reliability evaluation of light-emitting devices of examples and comparative examples;

DESCRIPTION OF THE EMBODIMENTS

First Embodiment

A first embodiment will be described below with reference to FIGS. 1 to 9. In this embodiment, a light-emitting device that inhibits the degradation of a quantum-dot phosphor will be described.

Light-Emitting Device 10

Figure 1:
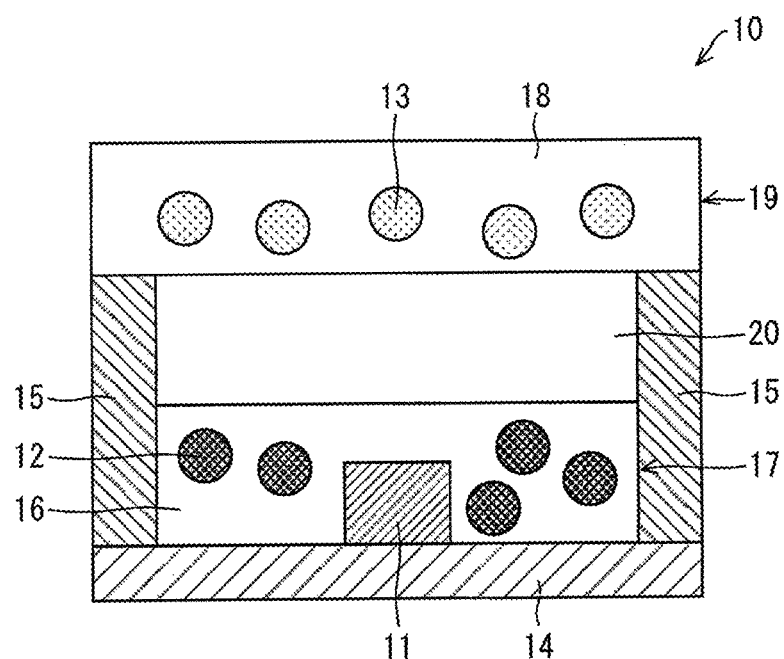
FIG. 1 is a cross-sectional view of a light-emitting device according to a first embodiment.

FIG. 1 is a cross-sectional view illustrating the structure of a light-emitting device 10 according to this embodiment. As illustrated in FIG. 1, the light-emitting device 10 includes a light-emitting element 11 configured to emit blue light, a first wavelength conversion member 17, and a second wavelength conversion member 19.

The first wavelength conversion member 17 is a member in which a $Mn^{4+}$-activated fluorine complex phosphor 12 that is excited by blue light to emit red light is dispersed in a first dispersion medium 16. The second wavelength conversion member 19 is a member in which a quantum-dot phosphor 13 that is excited by blue light to emit green light is dispersed in a second dispersion medium 18.

The first wavelength conversion member 17 may seal the light-emitting element 11 therein. The second wavelength conversion member 19 faces the light-emitting element 11. Thus, the $Mn^{4+}$-activated fluorine complex phosphor 12 in the first wavelength conversion member 17 and the quantum-dot phosphor 13 in the second wavelength conversion member 19 are irradiated with blue light emitted from the light-emitting element 11.

The $Mn^{4+}$-activated fluorine complex phosphor 12 and the quantum-dot phosphor 13 irradiated with blue light emit red light and green light, respectively. As a result, the light-emitting device 10 emits white light provided by the mixture of (i) blue light emitted from the light-emitting element 11, (ii) red light emitted from the $Mn^{4+}$-activated fluorine complex phosphor 12, and (iii) green light emitted from the quantum-dot phosphor 13.

The light-emitting device 10 further includes a substrate 14 serving as a printed wiring board and a resin frame 15. The light-emitting element 11 and the resin frame 15 are placed on the substrate 14.

The resin frame 15 functions as a spacer configured to spatially separate the first wavelength conversion member 17 from the second wavelength conversion member 19. Specifically, the height of the resin frame 15 in the direction perpendicular to the substrate 14 may be larger than that of the first wavelength conversion member 17 in the direction perpendicular to the substrate 14. The second wavelength conversion member 19 is placed on the resin frame 15.

This structure provides a space 20 between the first wavelength conversion member 17 and the second wavelength conversion member 19. That is, the first wavelength conversion member 17 is spatially separated from the second wavelength conversion member 19.

The light-emitting element 11 may be sealed in the first wavelength conversion member 17. The second wavelength conversion member 19 faces the first wavelength conversion member 17 with the space 20 provided therebetween. Thus, a distance between the light-emitting element 11 and the second wavelength conversion member 19 may be larger than a distance between the light-emitting element 11 and the first wavelength conversion member 17. The light-emitting element 11 may be arranged outside the first wavelength conversion member 17.

Light-Emitting Element 11

The light-emitting element 11 emits blue light serving as an excitation light. Any light-emitting element may be used as the light-emitting element 11 as long as it emits primary light (blue light) to be absorbed by the $Mn^{4+}$-activated fluorine complex phosphor 12 and the quantum-dot phosphor 13 to allow them to fluoresce. As the light-emitting element 11, for example, a gallium nitride (GaN)-based semiconductor may be used.

Blue light emitted from the light-emitting element 11 may have a peak wavelength of about 420 nm or more and about 480 nm or less. When the blue light has a peak wavelength of about 420 nm or more and about 480 nm or less, the luminous efficiency of the light-emitting element 11 is increased. Thus, the luminous efficiency of the light-emitting device 10 is increased.

The blue light may have a peak wavelength of about 440 nm or more and about 460 nm or less. When the blue light has a peak wavelength of about 440 nm or more and about 460 nm or less, the light-emitting element 11 has particularly high luminous efficiency. Furthermore, when the blue light has a peak wavelength of about 440 nm or more and about 460 nm or less, the peak wavelength of the blue light is well matched to the excitation spectrum of the $Mn^{4+}$-activated fluorine complex phosphor 12 described below and the transmission spectrum of a blue color filter 126b described below, thus further improving the luminous efficiency of the light-emitting device 10.

$Mn^{4+}$-Activated Fluorine Complex Phosphor 12

As described above, the $Mn^{4+}$-activated fluorine complex phosphor 12 is excited by blue light emitted from the light-emitting element 11 to emit red light. An emission spectrum of the $Mn^{4+}$-activated fluorine complex phosphor 12 may have a half width of about 10 nm or less.

The light-emitting element 11 may be sealed in the first wavelength conversion member 17. Thus, blue light emitted from the light-emitting element 11 may be efficiently incident on the $Mn^{4+}$-activated fluorine complex phosphor 12 in the first wavelength conversion member 17, and thus the wavelength of the blue light may be efficiently converted.

As the $Mn^{4+}$-activated fluorine complex phosphor 12, for example, a phosphor represented by the following general formula (A) or (B) may be used:

$$MI_2(MII_{1-h}Mn_h)F_6 \qquad \text{general formula (A)}$$

where in general formula (A), MI contains at least one alkali metal element selected from Li, Na, K, Rb, and Cs, MII contains at least one tetravalent metal element selected from Ge, Si, Sn, Ti, and Zr, and the range of the value of h is about $0.001 \leq h \leq about\ 0.1$.

In general formula (A), MI may be K because of high emission intensity and high stability of phosphor crystals. For the same reason, MII may contain Ti or Si.

In general formula (A), the value of h indicates the composition ratio (concentration) of Mn, i.e., the concentration of $Mn^{4+}$. A value of h less than about 0.001 results in an insufficient concentration of $Mn^{4+}$ serving as a light-emitting ion, thus leading to insufficient brightness of red light emitted from the $Mn^{4+}$-activated fluorine complex phosphor 12. A value of h more than about 0.1 results in an excessive concentration of $Mn^{4+}$. This causes concentration quenching and so forth to reduce the brightness of red light emitted from the $Mn^{4+}$-activated fluorine complex phosphor 12.

That is, the $Mn^{4+}$-activated fluorine complex phosphor 12 represented by general formula (A) may be $K_2(Ti_{1-h}Mn_h)F_6$ or $K_2(Si_{1-h}Mn_h)F_6$, and h may be about 0.001 or more and about 0.1 or less.

$$MIII(MII_{1-h}Mn_h)F_6 \qquad \text{general formula (B)}$$

where in general formula (B), MIII contains at least one alkaline-earth metal element selected from Mg, Ca, Sr, and Ba, MII contains at least one tetravalent metal element selected from Ge, Si, Sn, Ti, and Zr, and the range of the value of h is about $0.001 \leq h \leq about\ 0.1$.

In general formula (B), MIII may contain at least Ba because the phosphor has high luminous efficiency and the phosphor is less likely to degrade by heat and an external force. For the same reason, MII may contain Ti or Si. In general formula (B), the value of h, which indicates the composition ratio (concentration) of Mn, may be about $0.001 \leq h \leq about\ 0.1$, as with h in general formula (A).

That is, the $Mn^{4+}$-activated fluorine complex phosphor 12 represented by general formula (B) may be $Ba(Ti_{1-h}Mn_h)F_6$ or $Ba(Si_{1-h}Mn_h)F_6$, and h may be about 0.001 or more and 0.1 or less.

In particular, in the case where the $Mn^{4+}$-activated fluorine complex phosphor 12 is represented by any of general formulae (A) and (B), MII may be Si because the resulting phosphor has low solubility in water and high resistance to water.

The emission spectrum of the $Mn^{4+}$-activated fluorine complex phosphor 12 has a small half-width of about 10 nm or less in the case where the $Mn^{4+}$-activated fluorine complex phosphor 12 is represented by any of general formulae (A) and (B). This is attributed to the properties of $Mn^{4+}$ serving as a light-emitting ion.

Quantum-Dot Phosphor 13

To achieve a wider color reproduction range of green than those of the semiconductor light-emitting devices disclosed in International Publication No. 2009/110285 and Japanese Unexamined Patent Application Publication No. 2010-93132, it is conceivable that a structure includes a quantum-dot phosphor serving as a green phosphor. The equalization of the particle diameters of quantum dots of the quantum-dot phosphor enables the half width of the emission spectrum of the quantum-dot phosphor to be theoretically reduced to about 15 nm. Narrow-line-width green phosphors that provide emission spectra each having a half width of about 40 nm or less have already been produced.

Thus, the use of the quantum-dot phosphor 13 serving as a green phosphor results in a wide color reproduction range of green, compared with the combination of the phosphors in which the green phosphor provides an emission spectrum with a half width of about 55 nm and which are described in International Publication No. 2009/110285 and Japanese Unexamined Patent Application Publication No. 2010-93132.

As described above, the quantum-dot phosphor 13 is excited by blue light emitted from the light-emitting element 11 to emit green light. The emission spectrum of the green light emitted from the quantum-dot phosphor 13 may have a peak wavelength of about 520 nm or more and about 540 nm or less. In the case where the emission spectrum of the quantum-dot phosphor 13 has a peak wavelength less than about 520 nm or more than about 540 nm, when the light-emitting device 10 is used as a backlight for an image display apparatus, the color reproducibility of the image display apparatus is degraded. For example, the coverage of the Adobe RGB color gamut is reduced.

The emission spectrum of the quantum-dot phosphor 13 may have a half width of about 25 nm or more. In this case, in the production process of the quantum-dot phosphor 13, the acceptable range of variations in particle diameter is increased. This improves the production yield of the quantum-dot phosphor 13 to reduce the production cost of the quantum-dot phosphor 13 and then the production cost of the light-emitting device 10.

In this embodiment, the emission spectrum of the $Mn^{4+}$-activated fluorine complex phosphor 12 may have a small half width of about 10 nm or less, as described above. In this case, even if the half width of the emission spectrum of the quantum-dot phosphor 13 is increased, only a small overlap is observed between the emission spectrum of the quantum-dot phosphor 13 and the emission spectrum of the $Mn^{4+}$-activated fluorine complex phosphor 12. Thus, the color reproducibility of the image display apparatus including the light-emitting device 10 is less likely to deteriorate. That is, even though the half width of the emission spectrum of the quantum-dot phosphor 13 may be limited to about 25 nm or more, it is possible to produce an image display apparatus having high color reproducibility.

A semiconductor crystalline material contained in the quantum-dot phosphor may be a phosphor material that efficiently emits visible light. Examples of the material include II-VI group compound semiconductors, group III-nitride semiconductors, and chalcopyrite materials. More specifically, the quantum-dot phosphor may be composed of any of CdSe, CdS, CdTe, InP, InN, AlInN, InGaN, AlGaInN, and CuInGaSe.

The adjustment of the particle diameter or material composition of the quantum-dot phosphor enables the adjustment of the energy band gap of the quantum-dot phosphor. This enables the emission of fluorescent light of various wavelengths.

Material of First Dispersion Medium 16

In the first wavelength conversion member 17, the first dispersion medium 16 serves as a dispersion medium in which the $Mn^{4+}$-activated fluorine complex phosphor 12 is dispersed. The material of the first dispersion medium 16 may be, but is not particularly limited to, a resin material, for example, a methyl-based silicone resin, a phenyl-based silicone resin, an epoxy-based resin, an acrylic-based resin, or a silsesquioxane-based UV-curable resin, because of a low-temperature production process.

The first dispersion medium 16 is exposed to blue light emitted from the light-emitting element 11. Thus, the first dispersion medium 16 may be composed of a material having high transmittance for light of short wavelengths and high resistance to light and heat. Specifically, the material of the first dispersion medium 16 may be a silicone resin, in particular, a stable methyl-based silicone resin. Among methyl-based silicone resins, the material of the first dispersion medium 16 may be a dimethylsilicone resin because the dimethylsilicone resin has particularly high resistance to light and heat.

In the first wavelength conversion member 17, the mixing ratio of the $Mn^{4+}$-activated fluorine complex phosphor 12 to the first dispersion medium 16 is described below. The $Mn^{4+}$-activated fluorine complex phosphor 12 is preferably mixed in a mixing ratio of about 1% to about 60% by weight with respect to 100% by weight of the first dispersion medium 16. The $Mn^{4+}$-activated fluorine complex phosphor 12 is more preferably mixed in a mixing ratio of about 5% to about 30% by weight with respect to 100% by weight of the first dispersion medium 16.

Material of Second Dispersion Medium 18

In the second wavelength conversion member 19, the second dispersion medium 18 serves as a dispersion medium in which the quantum-dot phosphor 13 is dispersed. The material of the second dispersion medium 18 may be, but is not particularly limited to, a resin material, for example, a methyl-based silicone resin, a phenyl-based silicone resin, an epoxy-based resin, an acrylic-based resin, or a silsesquioxane-based UV-curable resin, because of a low-temperature production process.

The quantum-dot phosphor 13 may be deactivated by oxygen in air or heat. Thus, the second dispersion medium 18 may be composed of a material which has high gas barrier properties and which is produced by a low-temperature process. Specifically, the material of the second dispersion medium 18 may be a phenyl-based silicone resin, an acrylic-based resin, or a silsesquioxane-based UV-curable resin. The material of the second dispersion medium 18 may be an acrylic-based resin because the material is easily processed into a desired form by a low-temperature process.

In the second wavelength conversion member 19, the mixing ratio of the quantum-dot phosphor 13 to the second dispersion medium 18 is described below. The quantum-dot phosphor 13 is preferably mixed in a mixing ratio of about 0.1% to about 30% by weight with respect to 100% by weight of the second dispersion medium 18. The quantum-dot phosphor 13 is more preferably mixed in a mixing ratio of about 0.5% to about 20% by weight with respect to 100% by weight of the second dispersion medium 18.

Effect of Light-Emitting Device 10

When the $Mn^{4+}$-activated fluorine complex phosphor 12 is excited by strong blue light, a minute amount of fluorine is produced from the surface of the $Mn^{4+}$-activated fluorine complex phosphor 12 by, for example, heat due to energy loss during wavelength conversion, i.e., Stokes loss. The fluorine produced from the $Mn^{4+}$-activated fluorine complex phosphor 12 is formed into fluorine gas or a fluorine product. An example of the fluorine product is hydrofluoric acid formed by allowing fluorine to react with water.

When the quantum-dot phosphor 13 is dispersed in the first dispersion medium 16 in which the $Mn^{4+}$-activated fluorine complex phosphor 12 is dispersed, the foregoing fluorine product attacks the quantum-dot phosphor 13 to reduce the luminous efficiency of the quantum-dot phosphor 13.

It is well known that quantum-dot phosphors come into contact with oxygen gas to reduce the luminous efficiency of quantum-dot phosphors. The inventors have repeatedly experimented with a prototype light-emitting device and have first found that in the case where a combination of a quantum-dot phosphor and a $Mn^{4+}$-activated fluorine complex is used as a phosphor for the light-emitting device and where the quantum-dot phosphor and the $Mn^{4+}$-activated fluorine complex are excited by strong excitation light, the luminous efficiency of the quantum-dot phosphor is reduced by the fluorine product formed from the $Mn^{4+}$-activated fluorine complex.

In the light-emitting device 10, the quantum-dot phosphor 13 is dispersed in the second dispersion medium 18, which is a dispersion medium different from the first dispersion medium 16 in which the $Mn^{4+}$-activated fluorine complex phosphor 12 is dispersed, as described above. In the light-emitting device 10, the first dispersion medium 16 and the second dispersion medium 18 are separated from each other with the space 20 provided therebetween.

Accordingly, the foregoing fluorine product is less likely to reach the quantum-dot phosphor 13, thus effectively inhibiting attack of the fluorine product on the quantum-dot phosphor 13.

The quantum-dot phosphor 13 has a particle diameter of several nanometers to several tens of nanometers. The $Mn^{4+}$-activated fluorine complex phosphor 12 has a particle diameter of several micrometers to several tens of micrometers. Thus, the quantum-dot phosphor 13 has high reactivity and is liable to be degraded by heat, compared with the $Mn^{4+}$-activated fluorine complex phosphor 12.

A difference in energy between red light and blue light is larger than a difference in energy between green light and blue light. Thus, in the $Mn^{4+}$-activated fluorine complex phosphor 12 that emits red light, the amount of heat generated by the Stokes loss is large, compared with the quantum-dot phosphor 13 that emits green light.

In the light-emitting device 10, the second wavelength conversion member 19 is further from the light-emitting element 11 than the first wavelength conversion member 17, as described above. Thus, the quantum-dot phosphor 13 which is liable to be degraded by heat and which generates only a small amount of heat is separated from the $Mn^{4+}$-activated fluorine complex phosphor 12 and the light-emitting element 11.

Therefore, the structure of the light-emitting device 10 also has the effect of inhibiting the degradation of the quantum-dot phosphor 13 due to heat generated from the light-emitting element 11 and the $Mn^{4+}$-activated fluorine complex phosphor 12.

Production Example of $Mn^{4+}$-Activated Fluorine Complex Phosphor 12

Figure 2:
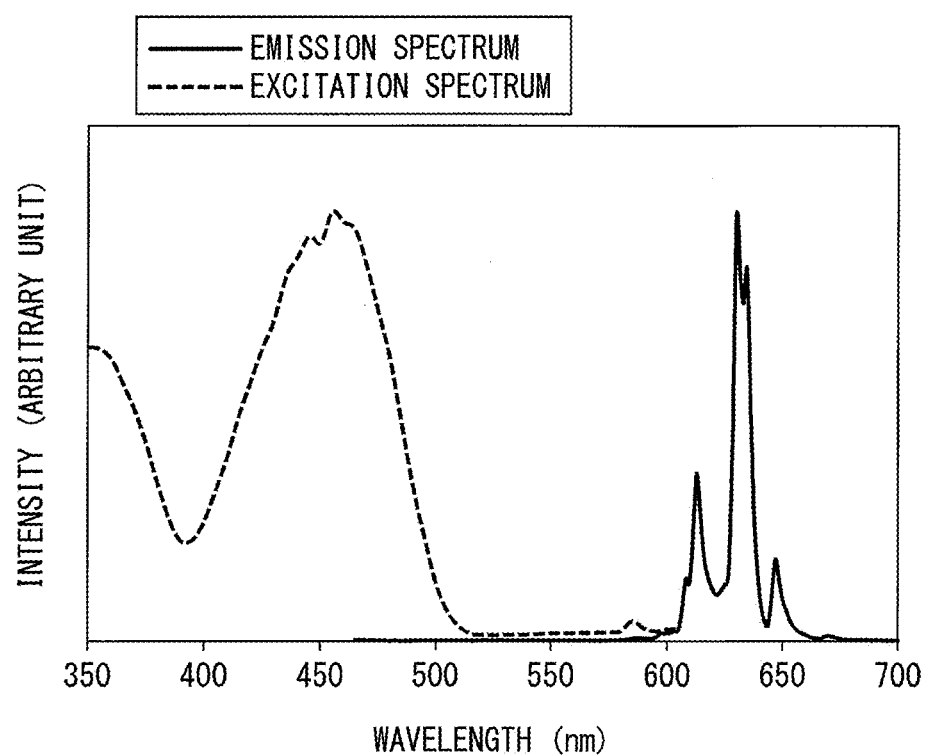
FIG. 2 is a graph depicting the emission spectrum and the excitation spectrum of a $Mn^{4+}$-activated fluorine complex phosphor.

A production example of the $Mn^{4+}$-activated fluorine complex phosphor 12 will be described below with reference to FIG. 2. FIG. 2 is a graph depicting the emission spectrum and the excitation spectrum of the $Mn^{4+}$-activated fluorine complex phosphor 12 produced in production example R1.

Production Example R1: Production Example of the $Mn^{4+}$-Activated Fluorine Complex Phosphor 12

The $Mn^{4+}$-activated fluorine complex phosphor 12 represented by general formula (A) described above was prepared by a procedure described below, where in general formula (A), MI represented K, MII represented Si, and h=0.06.

A divider (diaphragm) formed of a fluorocarbon resin-based ion-exchange membrane was arranged in the middle of a reaction vessel composed of a vinyl chloride resin. An anode was arranged in one of the resulting two compartments with the ion-exchange membrane provided therebetween, and a cathode was arranged in the other compartment, each of the anode and the cathode being formed of a platinum plate. Hydrofluoric acid containing manganese(II) fluoride dissolved therein was charged into the compartment on the anode side of the reaction vessel. Hydrofluoric acid was charged into the compartment on the cathode side of the reaction vessel.

The anode and the cathode were connected to a power source. Electrolysis was performed at a voltage of 3 V and a current of 0.75 A. After the completion of the electrolysis, the addition of excess hydrofluoric acid saturated with potassium fluoride to a reaction solution on the anode side produced $K_2MnF_6$ as a yellow solid product. The solid product was filtered and recovered to give $K_2MnF_6$.

Next, 4.8 g of silicon dioxide was dissolved in 100 $cm^3$ of 48% by mass of hydrofluoric acid to prepare a silicon fluoride-containing aqueous solution. The resulting aqueous solution was left to cool to room temperature. The aqueous solution was charged into a resin vessel with a lid and heated in a water bath held at 70° C. for 1 hour or more. To the silicon fluoride-containing aqueous solution, 1.19 g of the foregoing $K_2MnF_6$ powder was added. The resulting mixture was stirred to dissolve the $K_2MnF_6$ powder, thereby preparing an aqueous solution containing silicon fluoride and $K_2MnF_6$ (first solution).

Next, 13.95 g of potassium fluoride was dissolved in 40 $cm^3$ of 48% by mass of hydrofluoric acid. The mixture was left to cool to room temperature, thereby preparing a potassium fluoride-containing aqueous solution (second solution).

The second solution was gradually added to the first solution under stirring over a period of about 2.5 minutes. The resulting mixture was stirred for 10 minutes to form a light-orange-colored solid. The solid product was separated by filtering and washed with a small amount of 20% by mass of hydrofluoric acid. The solid product was further washed with ethanol and dried in vacuo to give 15.18 g of a $Mn^{4+}$-activated fluorine complex phosphor.

The X-ray diffraction pattern of the resulting $Mn^{4+}$-activated fluorine complex phosphor was measured with an X-ray diffractometer (manufactured by Rigaku Corporation) using $CuK\alpha$ radiation. The measurement results demonstrated that a $K_2SiF_6$ phase was formed.

The emission spectrum of the $Mn^{4+}$-activated fluorine complex phosphor was measured. Specifically, the $Mn^{4+}$-activated fluorine complex phosphor was tightly packed by tapping in a quartz cell having a width of 10 mm, a length of 10 mm, and a depth of 50 mm. The emission spectrum of the $Mn^{4+}$-activated fluorine complex phosphor in the quartz cell when the $Mn^{4+}$-activated fluorine complex phosphor was excited by light with a wavelength of 445 nm was measured with a spectrofluorometer (Model: FluoroMax-4, manufactured by HORIBA, Ltd).

As a result of the measurement of the $Mn^{4+}$-activated fluorine complex phosphor, an emission spectrum plotted in a solid line in FIG. 2 was obtained. Analysis of the emission spectrum in FIG. 2 revealed that the emission spectrum of the $Mn^{4+}$-activated fluorine complex phosphor had a peak wavelength of 630 nm and a half width of 8 nm.

The emission intensity of the $Mn^{4+}$-activated fluorine complex phosphor at a peak wavelength of 630 nm was plotted as a function of wavelength of excitation light to provide an excitation spectrum plotted in a dashed line in FIG. 2.

Production Example of Quantum-Dot Phosphor 13

Figure 3:
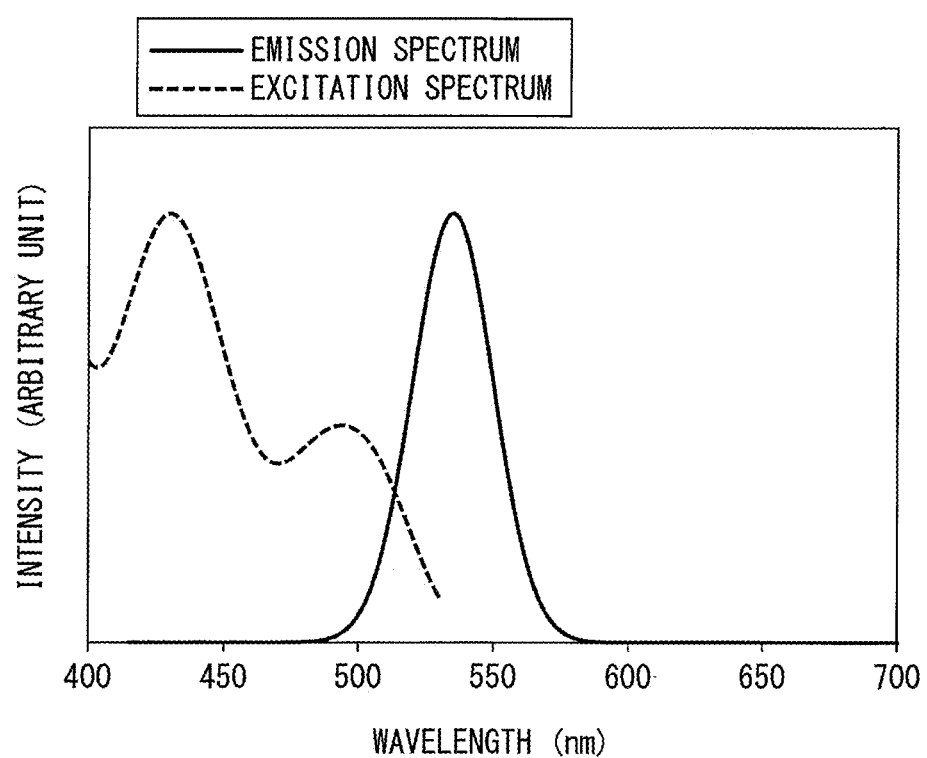
FIG. 3 is a graph depicting the emission spectrum and the excitation spectrum of a quantum-dot phosphor.

A production example of the quantum-dot phosphor 13 will be described below with reference to FIG. 3. FIG. 3 is a graph depicting the emission spectrum and the excitation spectrum of the quantum-dot phosphor produced in production example QD1-1.

Any known method for producing a quantum-dot phosphor may be employed as a method for producing the quantum-dot phosphor, without any particular limitation. A chemical synthetic method may be employed in view of its simple technique and low cost. In the chemical synthetic method, a plurality of starting substances containing elements constituting a target product are dispersed in a medium and then allowed to react with each other to give the target product.

Examples of the chemical synthetic method include a sol-gel method (colloidal method), a hot-soap method, a reverse-micelle method, a solvothermal method, a molecular precursor method, a hydrothermal synthesis method, and a flux method. From the viewpoint of appropriately producing semiconductor nanoparticles composed of a compound semiconductor material, the hot-soap method may be employed.

An example of a method for producing a quantum-dot phosphor formed of CdSe/ZnS semiconductor nanoparticles each including a CdSe core and a ZnS shell by the hot-soap method will be described below.

Production Example QD1-1: Quantum Dots with a Peak Wavelength of 535 nm and a Half Width of 35 nm CdSe cores were first synthesized. About 3 mL of trioctylphosphine (TOP) was mixed with about 1 mmol of trioctylphosphine selenide (TOPSe) and about 1 mmol of dimethylcadmium in an inert atmosphere to prepare a mixture solution.

The mixture solution was heated to 350° C. in a nitrogen atmosphere, and then 5 g of trioctylphosphine oxide (TOPO) was injected into the mixture solution. The mixture solution reacted with TOPO to form CdSe nanocrystals while the temperature of the mixture solution was lowered to about 260° C. The reaction between the mixture solution and TOPO was continued for 70 minutes. The resulting reaction solution was immediately cooled to room temperature for termination of the reaction.

A classification step was repeated 5 times on the reaction solution, the classification step including three operations: (i) an operation of adding 10 mL of dehydrated ethanol serving as a poor solvent to the reaction solution to precipitate a quantum-dot phosphor; (ii) an operation of performing centrifugal separation at 4000 rpm for 10 minutes to settle the quantum-dot phosphor; and (iii) an operation of adding dehydrated toluene to the centrifuged mixture to redissolve the quantum-dot phosphor. The classification step provided a CdSe core solution containing the synthesized CdSe cores in the reaction solution.

Subsequently, ZnS shells were synthesized. To the CdSe core solution that had been prepared by the foregoing technique, 3 mmol of zinc acetate and 3 mL of a TOP solution containing 3 mmol sulfur serving as raw materials for shell layers were added. The mixture was allowed to react at 150° C. for 2 hours and then cooled to room temperature. Thereby, a quantum-dot phosphor composed of CdSe/ZnS was produced.

The emission spectrum of the CdSe/ZnS quantum dots (hereinafter, referred to as "quantum dots of Production example QD1-1") produced by the foregoing procedure was measured. Specifically, a solution of the quantum dots of Production example QD1-1 dispersed in a toluene solution was loaded into a quartz cell having a width of 10 mm, a length of 10 mm, and a depth of 50 mm. The emission spectrum of the CdSe/ZnS quantum dots in the quartz cell when the CdSe/ZnS quantum dots were excited by light with a wavelength of 445 nm was measured with a spectrofluorometer (Model: FluoroMax-4, manufactured by HORIBA, Ltd).

As a result of the measurement of the quantum-dot phosphor of Production example QD1-1, an emission spectrum plotted in a solid line in FIG. 3 was obtained. Analysis of the emission spectrum in FIG. 3 revealed that the emission spectrum of the quantum-dot phosphor of Production example QD1-1 had a peak wavelength of 535 nm and a half width of 35 nm.

The emission intensity of the quantum-dot phosphor at a peak wavelength of 535 nm was plotted as a function of wavelength of excitation light to provide an excitation spectrum plotted in a dashed line in FIG. 3.

Examples and Comparative Examples of Light-Emitting Device Example D1

Example D1, in which the $Mn^{4+}$-activated fluorine complex phosphor 12 and the quantum-dot phosphor 13 produced in the foregoing production examples were used, will be described below as an specific example of the light-emitting device 10 illustrated in FIG. 1.

In this example, the first dispersion medium 16 was composed of a silicone resin (KER-2500, manufactured by Shin-Etsu Chemical Co., Ltd). The silicone resin was mixed with the $Mn^{4+}$-activated fluorine complex phosphor 12 produced in Production example R1 to provide a resin containing a red phosphor dispersed therein. The proportion by weight of the $Mn^{4+}$-activated fluorine complex phosphor 12 was 26% by weight with respect to 100% by weight of the silicone resin.

The light-emitting element 11 was placed on the substrate 14. The resin frame 15 was placed on the substrate 14 so as to surround the light-emitting element 11. The resin containing the red phosphor dispersed therein was charged into a portion surrounded by the resin frame 15, heated at 80° C. for 30 minutes, and then heated at 120° C. for 1 hour, thereby providing the first wavelength conversion member 17 in a state in which the light-emitting element serving as a blue LED was sealed. The resin frame 15 had a height of 1 mm in the direction perpendicular to the substrate 14. The first wavelength conversion member 17 had a height of about 0.5 mm, which was approximately half the height of the resin frame 15 as illustrated in FIG. 1.

The quantum dots produced in Production example QD1-1 were dispersed in toluene to prepare a quantum-dot dispersion with a concentration of 5% by weight. The quantum-dot dispersion was mixed with an acrylic resin (ACRYVIEWA (registered trademark), manufactured by Nippon Shokubai Co., Ltd.) to prepare a resin containing a green phosphor dispersed therein. The proportion by weight of the quantum-dot dispersion was 20% by weight with respect to 100% by weight of the acrylic resin.

The resin containing the green phosphor dispersed therein was cast into a fluorocarbon resin mold with a depth of 0.5 mm and allowed to stand at room temperature for 8 hours. The resin was heated at 100° C. for 8 hours under reduced pressure and formed into the second wavelength conversion member 19. The second wavelength conversion member 19 was bonded to the resin frame 15 to produce the light-emitting device 10.

Figure 4:
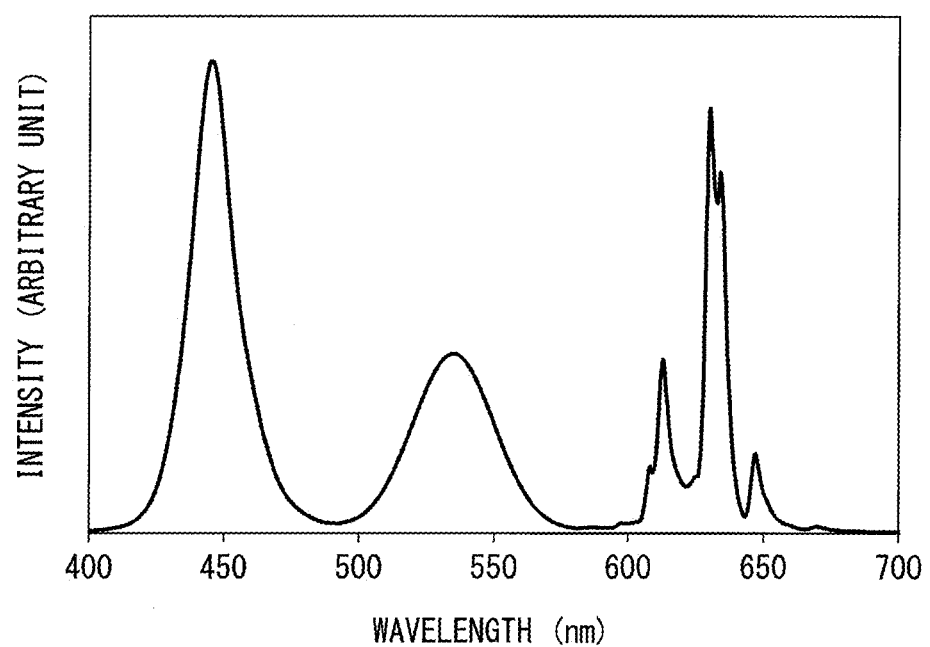
FIG. 4 is a graph depicting the emission spectrum of a light-emitting device according to an example of the present disclosure.

FIG. 4 is a graph depicting the emission spectrum of the light-emitting device 10 produced in Example D1. The light-emitting device 10 was driven at a drive current of 20 mA. The emission spectrum of the light-emitting device 10 was measured with a spectrophotometer (MCPD-7000, manufactured by Otsuka Electronics Co., Ltd.) to obtain the emission spectrum illustrated in FIG. 4. The CIE 1931 chromaticity coordinates of the light-emitting device 10 were calculated from the emission spectrum illustrated in FIG. 4 and found to be (CIEx, CIEy)=(0.256, 0.224).

The weight of the $Mn^{4+}$-activated fluorine complex phosphor 12 with respect to the weight of the silicone resin and the weight of the quantum dots with respect to the weight of the acrylic resin were adjusted in such a manner that the color temperature of a white point was about 10,000 K when light emitted from the light-emitting device 10 passed through a liquid crystal panel described below. In examples and comparative examples described below, the weight of the $Mn^{4+}$-activated fluorine complex phosphor 12 and the weight of the quantum-dot phosphor 13 were adjusted in the same way as above.

Example D2

Figure 5:
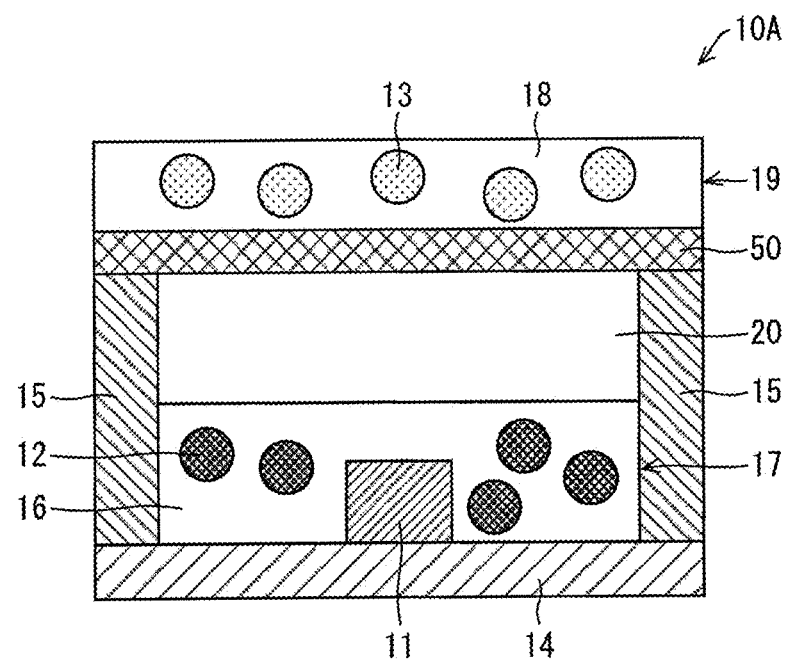
FIG. 5 is a cross-sectional view of the structure of a light-emitting device according to another example of the present disclosure.

FIG. 5 is a cross-sectional view illustrating the structure of another light-emitting device 10A in Example D2. As illustrated in FIG. 5, the light-emitting device 10A included a glass plate (blocking layer) 50 on a surface of the second wavelength conversion member 19 facing the first wavelength conversion member 17. Thus, the first wavelength conversion member 17 and the second wavelength conversion member 19 were separated from each other with the space 20 and the glass plate 50 provided therebetween.

A method for producing the light-emitting device 10A according to this example was different from Example D1 in two points: (i) the weight of the quantum-dot dispersion and (ii) a plate of the resin containing the green phosphor dispersed therein. The steps and the materials other than those in the items (i) and (ii) were used as in Example D1.

Regarding item (i), in Example D1, the weight of the quantum-dot dispersion was 20% by weight with respect to 100% by weight of the acrylic resin. In contrast, in this example, the weight of the quantum-dot dispersion was 35% by weight with respect to 100% by weight of the acrylic resin.

Regarding item (ii), in this example, a glass plate with a thickness of 0.2 mm was arranged in advance on the bottom of the fluorocarbon resin mold with a depth of 0.5 mm. The resin containing the green phosphor dispersed therein was cast thereon. Then, as with Example D1, the resin was allowed to stand at room temperature for 8 hours. Subsequently, the resin was heated at 100° C. for 8 hours under reduced pressure and formed into the second wavelength conversion member 19 bonded to the glass plate 50.

Example D3

Figure 6:
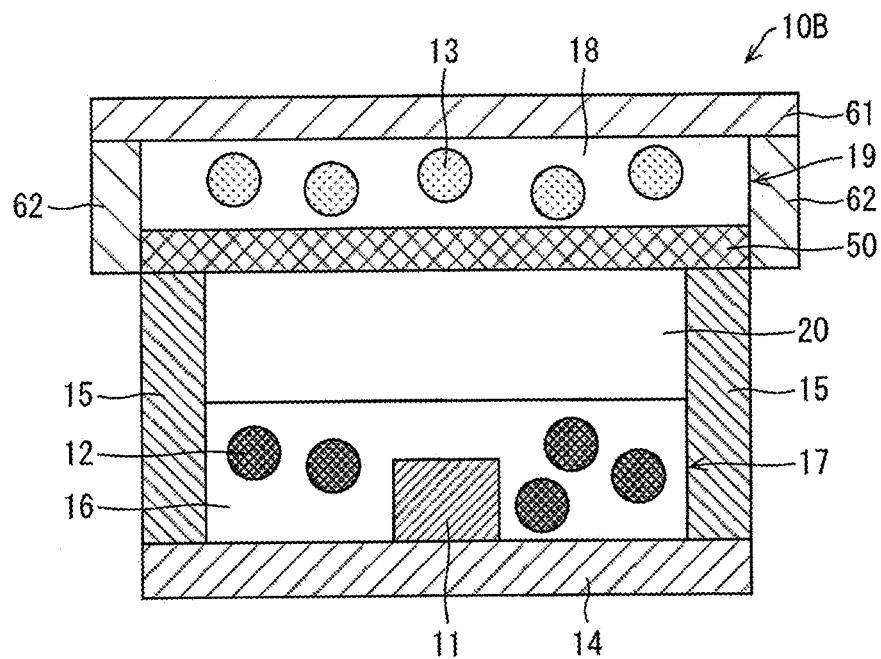
FIG. 6 is a cross-sectional view of the structure of a light-emitting device according to another example of the present disclosure.

FIG. 6 is a cross-sectional view illustrating the structure of another light-emitting device 10B in Example D3. As illustrated in FIG. 6, the light-emitting device 10B included a second glass plate 61 and a glass spacer 62 in addition to the glass plate 50.

The second glass plate 61 was arranged on a surface of the second wavelength conversion member 19 opposite the surface in contact with the glass plate 50. That is, the second wavelength conversion member 19 was located between the glass plate 50 and the second glass plate 61. The glass spacer 62 was arranged so as to surround surfaces of the second wavelength conversion member 19, the surfaces being not in contact with the glass plate 50 or the second glass plate 61.

Thus, the light-emitting device 10B, the second wavelength conversion member 19 was surrounded by the glass plate 50, the second glass plate 61, and the glass spacer 62. As with the light-emitting device 10A, the first wavelength conversion member 17 and the second wavelength conversion member 19 were separated from each other with the space 20 and the glass plate 50 provided therebetween.

A method for producing the light-emitting device 10B in this example was performed as in Example D2, except that (i) the second glass plate 61 was arranged on the surface of the second dispersion medium 18 opposite the glass plate 50, (ii) the surfaces of the second dispersion medium 18 were surrounded by the glass spacer 62, the surfaces being not in contact with the glass plate 50 or the second glass plate 61, and (iii) welding was performed between the glass plate 50 and the glass spacer 62 and between the second glass plate 61 and the glass spacer 62 by laser light irradiation.

Comparative Example D1

Figure 7:
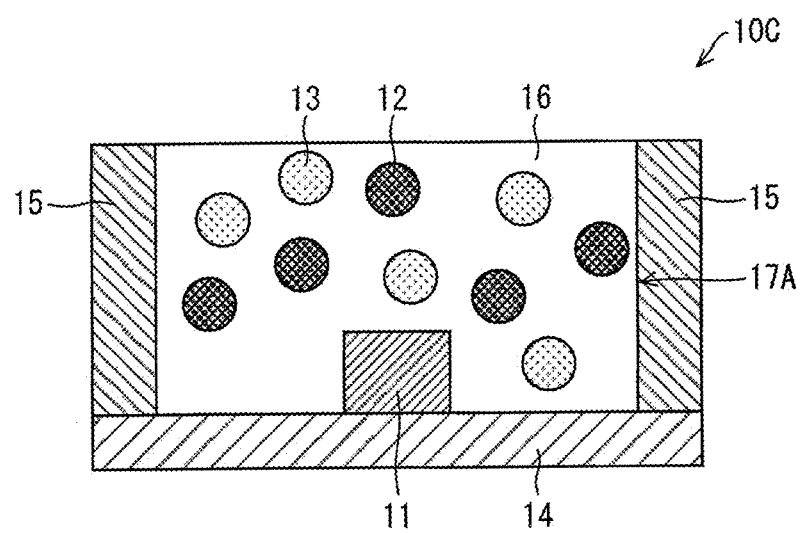
FIG. 7 is a cross-sectional view of the structure of a light-emitting device according to a comparable example.

FIG. 7 is a cross-sectional view illustrating the structure of a light-emitting device 10C in Comparative example D1. As illustrated in FIG. 7, the light-emitting device 10C included a single wavelength conversion member 17A. In the wavelength conversion member 17A, the $Mn^{4+}$-activated fluorine complex phosphor 12 and the quantum-dot phosphor 13 were both dispersed in the first dispersion medium 16.

As with the light-emitting device 10 and so forth, the first dispersion medium 16 of the light-emitting device 10C was composed of the silicone resin (KER-2500, manufactured by Shin-Etsu Chemical Co., Ltd). The silicone resin was mixed with the $Mn^{4+}$-activated fluorine complex phosphor 12 produced in Production example R1 to prepare a resin containing the red phosphor dispersed therein. The proportion by weight of the $Mn^{4+}$-activated fluorine complex phosphor 12 was 13.9% by weight with respect to 100% by weight of the silicone resin.

The quantum dots produced in Production example QD1-1 were dispersed in toluene to prepare a quantum-dot dispersion with a concentration of 5% by weight. The quantum-dot dispersion was mixed with the resin containing the red phosphor dispersed therein to prepare a resin in which the phosphors were dispersed. The proportion by weight of the quantum-dot dispersion was 10% by weight with respect to 100% by weight of the resin containing the red phosphor dispersed therein.

The light-emitting element 11 was placed on the substrate 14. The resin frame 15 was placed on the substrate 14 so as to surround the light-emitting element 11. The resin in which the phosphors were dispersed was charged into a portion surrounded by the resin frame 15, heated at 80° C. for 30 minutes, and then heated at 120° C. for 1 hour, thereby providing the wavelength conversion member 17A in a state in which the light-emitting element serving as a blue LED was sealed. In this way, the light-emitting device 10C was produced. The resin frame 15 had a height of 1 mm in the direction perpendicular to the substrate 14. The wavelength conversion member 17A had the same height as the resin frame 15, i.e., 1 mm, as illustrated in FIG. 7.

The light-emitting device 10C was driven at a drive current of 20 mA. The emission spectrum of the light-emitting device 10C was measured with a spectrophotometer (MCPD-7000, manufactured by Otsuka Electronics Co., Ltd.) to obtain the same emission spectrum as in Example D1, i.e., the emission spectrum illustrated in FIG. 4.

Comparative Example D2

Figure 8:
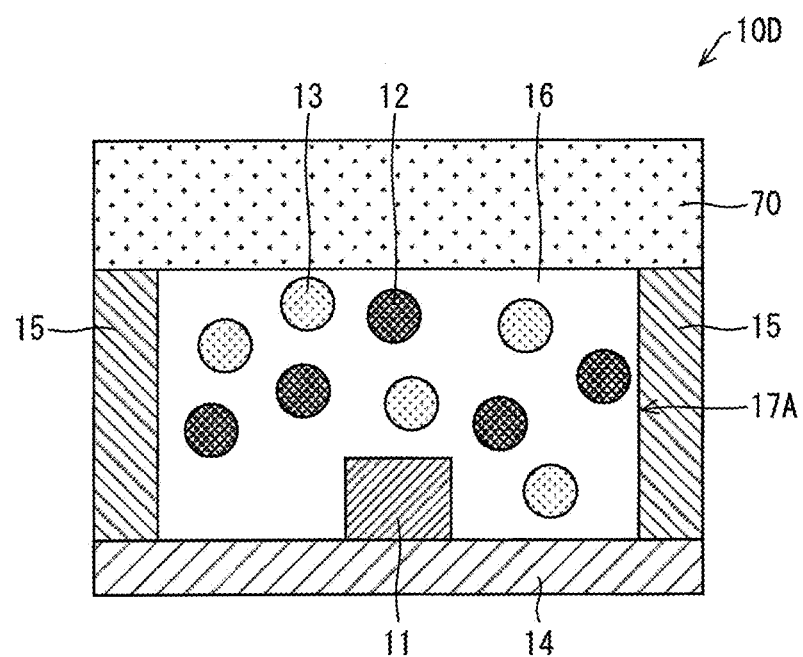
FIG. 8 is a cross-sectional view of the structure of a light-emitting device according to another comparable example.

FIG. 8 is a cross-sectional view illustrating the structure of a light-emitting device 10D in Comparative example D2. As illustrated in FIG. 8, in the light-emitting device 10D, a surface of the first dispersion medium 16 of the light-emitting device 10C illustrated in FIG. 7 was covered with a transparent resin layer 70 composed of an acrylic resin (ACRYVIEWA (registered trademark), manufactured by Nippon Shokubai Co., Ltd).

In a method for producing the light-emitting device 10D in this comparative example, the light-emitting device 10C was produced as in Comparative example D1. The acrylic resin was applied onto the surface of the first dispersion medium 16 to a thickness of 0.5 mm and allowed to stand at room temperature for 8 hours. The resin was then heated at 100° C. for 8 hours under reduced pressure to form the transparent resin layer 70.

Reliability Evaluation of Light-Emitting Device

An experiment was performed for evaluating the reliability of the light-emitting devices produced in Examples D1 to D3 and Comparative examples D1 and D2. Each of the light-emitting devices produced in Examples D1 to D3 and Comparative examples D1 and D2 was driven at a drive current of 50 mA for up to 500 hours. The time that the amount of luminous flux was reduced to 80% of the amount of luminous flux at the start of the driving (hereinafter, referred to as a "luminous flux decay time") was measured.

FIG. 9 is a table that lists the experimental results. As illustrated in FIG. 9, the luminous flux decay time of each of the light-emitting devices in Examples D1 to D3 is longer than those in Comparative examples D1 and D2. The experimental results illustrated in FIG. 9 reveal that in each of the light-emitting devices in Examples D1 to D3, even when strong excitation light generated by driving the light-emitting device at a high current of 50 mA is incident on the quantum-dot phosphor 13, the degradation of the quantum-dot phosphor 13, i.e., a reduction in luminous efficiency, is inhibited.

In particular, in the light-emitting device 10D in Comparative example D2, the surface of the first dispersion medium 16 is covered with the acrylic resin having high gas barrier properties. Thus, the influence of ambient air on the quantum-dot phosphor 13 in the light-emitting device 10D seems to be the same as that of the light-emitting device 10 in Example D1, the light-emitting device 10 including the second dispersion medium 18 in which the quantum-dot phosphor 13 is dispersed, the second dispersion medium 18 being composed of the acrylic resin.

However, the luminous flux decay time of the light-emitting device 10D in Comparative example D2 was ⅕ of the luminous flux decay time of the light-emitting device 10 in Example D1. This result demonstrates that unlike the related art, the degradation of the quantum-dot phosphor of the light-emitting device 10D in Comparative example D2 is not attributed to oxygen in air but to the fluorine product generated from the $Mn^{4+}$-activated fluorine complex phosphor 12.

As described above, in the light-emitting device according to this embodiment, the degradation of the quantum-dot phosphor, i.e., the reduction in luminous efficiency, due to the attack of the fluorine product generated from the $Mn^{4+}$-activated fluorine complex phosphor on the quantum-dot phosphor is inhibited.

Second Embodiment

Another embodiment of the present disclosure will be described below with reference to FIGS. 10A to 12B. In this embodiment, an image display apparatus including the light-emitting device according to the first embodiment will be described. For the purpose of illustration, members having the same functions as those of the members illustrated in the first embodiment are designated using the same reference numerals, and redundant description is not repeated.

Image Display Apparatus 100

Figure 10A:
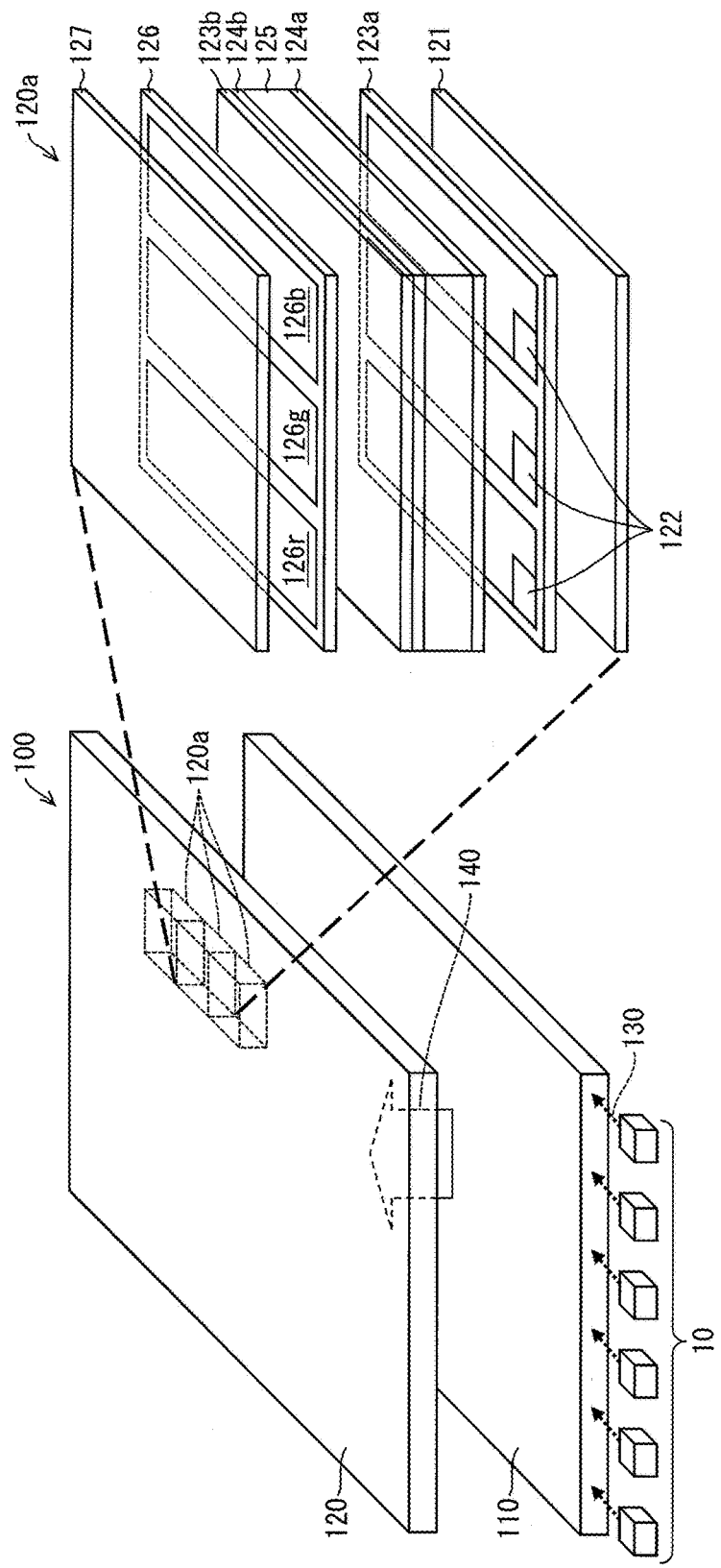
FIG. 10A is an exploded perspective view of an image display apparatus according to a second embodiment.
Figure 10B:
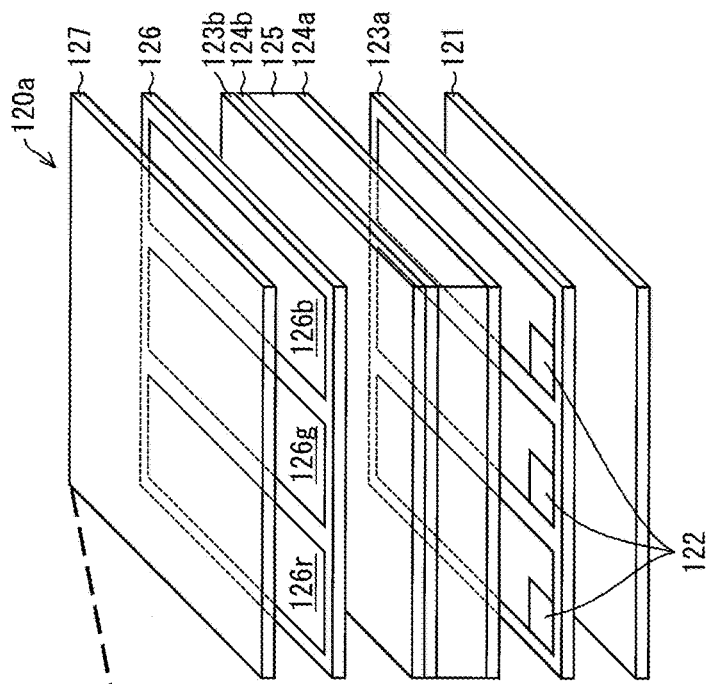
FIG. 10B is an exploded perspective view of a liquid crystal display device included in the image display apparatus illustrated in FIG. 10A.
Figure 11:
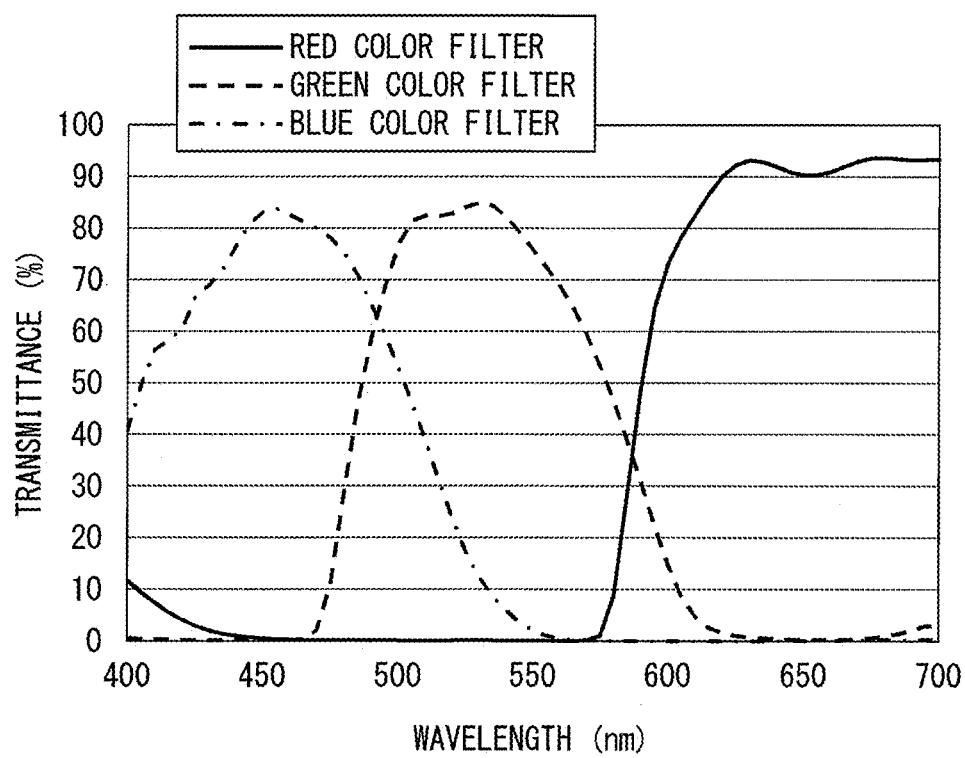
FIG. 11 is a graph depicting the transmission spectra of color filters included in the image display apparatus illustrated in FIG. 10A.

FIG. 10A is an exploded perspective view of an image display apparatus 100 according to this embodiment. FIG. 10B is an exploded perspective view of a liquid crystal display device 120a included in the image display apparatus 100 illustrated in FIG. 10A. FIG. 11 is a graph depicting the transmission spectra of color filters included in the image display apparatus 100.

As illustrated in FIG. 10A, the image display apparatus 100 includes the light-emitting devices 10, a light guide plate 110, and a liquid crystal display portion 120. The light guide plate 110 is a transparent or translucent light guide plate. The liquid crystal display portion 120 serves as a display area configured to display an image and includes a plurality of the liquid crystal display devices 120a.

In the image display apparatus 100, the plural light-emitting devices 10 are arranged on a side surface of the light guide plate 110. The liquid crystal display portion 120 is arranged adjacent to the light guide plate 110. The image display apparatus 100 has a structure such that outgoing light rays 130 emitted from the light-emitting devices 10 are scattered in the light guide plate 110 and converted into scattered light 140 and such that the entire surface of the liquid crystal display portion 120 is irradiated with the scattered light 140.

As described in the first embodiment, the light-emitting devices 10 are light-emitting devices in which the reduction in luminous efficiency is inhibited. Thus, the image display apparatus 100 including the light-emitting devices 10 is an image display apparatus in which the reduction in luminous efficiency is inhibited. The image display apparatus 100 may include the light-emitting devices 10A or the light-emitting devices 10B in place of the light-emitting devices 10.

Liquid Crystal Display Device 120a

As illustrated in FIG. 10B, each of the liquid crystal display devices 120a included in the liquid crystal display portion 120 includes a polarizer 121, a transparent conductive film 123a (including thin-film transistors 122), an alignment layer 124a, a liquid crystal layer 125, an alignment layer 124b, an upper thin-film electrode 123b, a color filter 126 configured to display color pixels, and an upper polarizer 127 stacked in that order.

The color filter 126 is divided into sections corresponding to pixels of the transparent conductive film 123a. The color filter 126 includes a red color filter 126r that transmits red light, a green color filter 126g that transmits green light, and the blue color filter 126b that transmits blue light.

The image display apparatus 100 according to this embodiment may include a filter that transmits red light, a filter that transmits green light, and a filter that transmits blue light, like the color filter 126 illustrated in FIG. 10B. In this case, as the red, green, and blue color filters, for example, color filters with transmission spectra illustrated in FIG. 11 may be used. In the following example, the color filters with the transmission spectra illustrated in FIG. 11 are used.

Example of Image Display Apparatus

Example DIS1

Figures 12A, 12B:
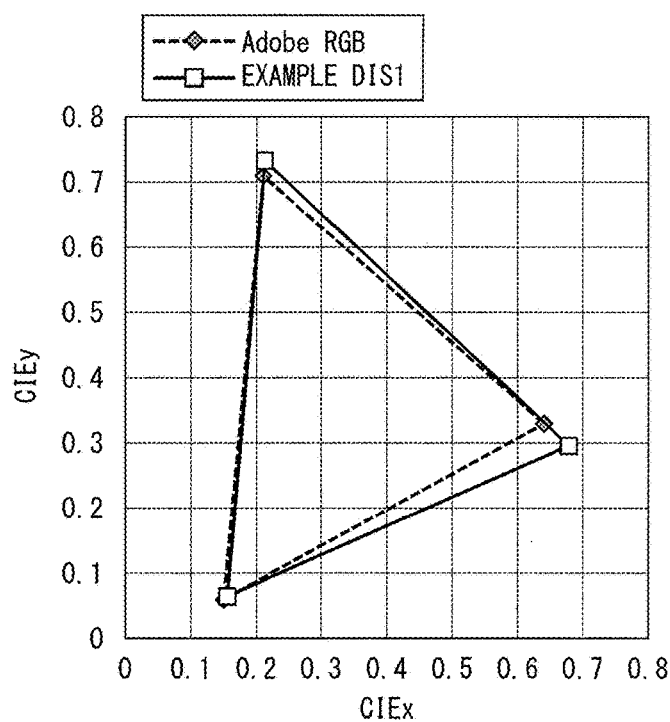
FIG. 12A is a table that lists the characteristics of an image display apparatus according to an example.
FIG. 12B is a graph to compare the color gamut of the image display apparatus of the example with the color gamut of Adobe RGB.

Example DIS1 is a specific example of the image display apparatus 100 having a structure illustrated in FIG. 10A. FIG. 12A is a table that lists the color temperature of the white point, the chromaticity coordinates of the white point, the red point, the green point, and the blue point on the CIE 1931 chromaticity coordinates, and the Adobe RGB coverage of the image display apparatus 100 of Example DIS1. FIG. 12B is a graph to compare the color gamut of the image display apparatus 100 of Example DIS1 with the color gamut of Adobe RGB.

In the table illustrated in FIG. 12A, each of the red point, the green point, and the blue point indicates a chromaticity point on a display when only light that transmits a corresponding one of the red color filter, the green color filter, and the blue color filter is displayed on the display. The white point indicates the chromaticity point on the display when light rays that transmit the color filters are simultaneously displayed. The Adobe RGB coverage indicates the proportion of the area of a color gamut represented by a triangle defined by the red point, the green point, and the blue point with respect to the area of the Adobe RGB color gamut.

As illustrated in FIG. 12A, the image display apparatus 100 produced in Example DIS1 had an Adobe RGB coverage of as high as 97.3%.

Third Embodiment

A third embodiment will be described below. The third embodiment is another embodiment of the light-emitting device described in the first embodiment. A light-emitting device according to this embodiment is the same as the light-emitting device 10, except for the light-emitting element 11. Thus, redundant description is not repeated.

In the light-emitting device according to this embodiment, primary light emitted from the light-emitting element has a peak wavelength of about 420 nm or more and about 440 nm or less. Even in the case where the light-emitting element that emits the primary light with the peak wavelength is used, it is possible to provide a light-emitting device that contributes to the production of an image display apparatus with a wide color reproduction range.

In the light-emitting device 10 according to the first embodiment, the peak wavelength of the primary light emitted from the light-emitting element 11 is well matched to the excitation spectrum of the $Mn^{4+}$-activated fluorine complex phosphor 12 illustrated in FIG. 2 and the transmission spectrum of the blue color filter 126b illustrated in FIG. 11. Thus, the light-emitting device 10 according to the first embodiment has higher luminous efficiency than the light-emitting device according to this embodiment.

Fourth Embodiment

A fourth embodiment will be described below. The fourth embodiment is another embodiment of the light-emitting device described in the first embodiment. A light-emitting device according to this embodiment is the same as the light-emitting device 10, except for the quantum-dot phosphor 13.

In the light-emitting device according to this embodiment, commercially available InP-based quantum dots that have an emission spectrum with a peak wavelength of 525 nm and a half width of 65 nm are used as a quantum-dot phosphor, in place of the CdSe/ZnS semiconductor nanoparticles.

The InP-based quantum dots have the emission spectrum with a large half width, compared with the CdSe/ZnS semiconductor nanoparticles. Thus, the image display apparatus including the light-emitting device according to this embodiment has low color reproducibility, compared with the image display apparatus including the light-emitting device 10.

However, the InP-based quantum dots do not contain Cd. Thus, the environmental load of the light-emitting device according to this embodiment is low, compared with the light-emitting device 10.

Gist

A light-emitting device (10) according to a first aspect of the present disclosure includes a light-emitting element (11) configured to emit blue light, a first wavelength conversion member (17) containing a $Mn^{4+}$-activated fluorine complex phosphor (12) that is excited by the blue light to emit red light, and a second wavelength conversion member (19) containing a quantum-dot phosphor (13) that is excited by the blue light to emit green light, in which the first wavelength conversion member and the second wavelength conversion member are spatially separated from each other.

In the foregoing structure, the light-emitting device includes the light-emitting element, the first wavelength conversion member, and the second wavelength conversion member. The first wavelength conversion member contains the $Mn^{4+}$-activated fluorine complex phosphor. The second wavelength conversion member contains the quantum-dot phosphor. The first wavelength conversion member and the second wavelength conversion member are spatially separated from each other.

Thus, a fluorine product generated from the $Mn^{4+}$-activated fluorine complex phosphor is less likely to reach the quantum-dot phosphor, thereby inhibiting the degradation of the quantum-dot phosphor.

Regarding a light-emitting device according to a second aspect of the present disclosure, in the first aspect, a distance between the light-emitting element and the second wavelength conversion member may be larger than a distance between the light-emitting element and the first wavelength conversion member.

In the forgoing structure, heat generated in the light-emitting element is less likely to conduct to the quantum-dot phosphor in the second wavelength conversion member, thus inhibiting the thermal degradation of the quantum-dot phosphor.

Regarding a light-emitting device according to a third aspect of the present disclosure, in the first or second aspect, the light-emitting element may be sealed in the first wavelength conversion member.

In the foregoing structure, the light-emitting element is sealed in the first wavelength conversion member containing the $Mn^{4+}$-activated fluorine complex phosphor, so that the blue light emitted from the light-emitting element is efficiently incident on the $Mn^{4+}$-activated fluorine complex phosphor.

Regarding a light-emitting device according to a fourth aspect of the present disclosure, the light-emitting device according to any of the first to third aspects may further include a blocking layer on a surface of the second wavelength conversion member facing the first wavelength conversion member.

In the foregoing structure, the light-emitting device includes the blocking layer between the quantum-dot phosphor in the second wavelength conversion member and the $Mn^{4+}$-activated fluorine complex phosphor in the first wavelength conversion member. Thus, the fluorine product generated from the $Mn^{4+}$-activated fluorine complex phosphor is even less likely to reach the quantum-dot phosphor, thereby further inhibiting the degradation of the quantum-dot phosphor.

Regarding a light-emitting device according to a fifth aspect of the present disclosure, in any of the first to fourth aspects, an emission spectrum of the quantum-dot phosphor may have a peak wavelength of about 520 nm or more and about 540 nm or less.

In the foregoing structure, the green light has a peak wavelength of about 520 nm or more and about 540 nm or less, thus improving the color reproducibility of an image display apparatus including the light-emitting device according to the present disclosure. It is therefore possible to provide the light-emitting device that contributes to the production of an image display apparatus with a wide color reproduction range.

Regarding a light-emitting device according to a sixth aspect of the present disclosure, in any of the first to fifth aspects, an emission spectrum of the quantum-dot phosphor may have a half width of about 25 nm or more.

In the foregoing structure, the emission spectrum of the quantum-dot phosphor has a relatively wide half width of about 25 nm or more, thereby increasing the acceptable range of variations in the particle diameter of the quantum-dot phosphor that emits green light. This improves the yield of the quantum-dot phosphor.

Regarding a light-emitting device according to a seventh aspect of the present disclosure, in any of the first to sixth aspects, an emission spectrum of the $Mn^{4+}$-activated fluorine complex phosphor may have a half width of about 10 nm or less.

In the foregoing structure, the emission spectrum of the $Mn^{4+}$-activated fluorine complex phosphor has a small half-width of about 10 nm or less. This improves the color reproducibility of an image display apparatus including the light-emitting device according to the present disclosure.

Regarding a light-emitting device according to an eighth aspect of the present disclosure, in any of the first to seventh aspects, the first wavelength conversion member may include a dispersion medium (first dispersion medium 16), in which the $Mn^{4+}$-activated fluorine complex phosphor may be dispersed in the dispersion medium, and the dispersion medium may contain a methyl-based silicone resin.

In the foregoing structure, the first wavelength conversion member contains the dispersion medium in which the $Mn^{4+}$-activated fluorine complex phosphor is dispersed, and the dispersion medium contains the methyl-based silicone resin. Thus, the dispersion medium has high transmittance for light of short wavelengths and high resistance to light and heat.

Regarding a light-emitting device according to a ninth aspect of the present disclosure, in any of the first to eighth aspects, the second wavelength conversion member may include a dispersion medium (second dispersion medium 18), in which the quantum-dot phosphor may be dispersed in the dispersion medium, and the dispersion medium may contain any of a phenyl-based silicone resin, an acrylic-based resin, and a silsesquioxane-based UV-curable resin.

In the foregoing structure, the second wavelength conversion member contains the dispersion medium in which the quantum-dot phosphor is dispersed, and the dispersion medium contains any of a phenyl-based silicone resin, an acrylic-based resin, and a silsesquioxane-based UV-curable resin. Thus, the dispersion medium has high gas barrier properties and is produced by a low-temperature process. Thus, the quantum-dot phosphor in the second wavelength conversion member is less likely to be deactivated by an oxygen component in air and/or heat.

Regarding a light-emitting device according to a tenth aspect of the present disclosure, in any of the first to ninth aspects, the quantum-dot phosphor may be composed of any of CdSe, CdS, CdTe, InP, InN, AlInN, InGaN, AlGaInN, and CuInGaSe.

In the foregoing structure, the quantum-dot phosphor may be composed of a material that efficiently emits visible light.

Regarding a light-emitting device according to an eleventh aspect of the present disclosure, in any of the first to tenth aspects, the $Mn^{4+}$-activated fluorine complex phosphor may be represented by the general formula $MI_2(MII_{1-h}Mn_h)F_6$, where MI may contain at least one alkali metal element selected from Li, Na, K, Rb, and Cs, MII may contain at least one tetravalent metal element selected from Ge, Si, Sn, Ti, and Zr, and h may represent 0.001 or more and 0.1 or less.

In the foregoing structure, the concentration of the $Mn^{4+}$ ions specified by h is an appropriate concentration. This enhances the emission intensity of the $Mn^{4+}$-activated fluorine complex phosphor.

Regarding a light-emitting device according to a twelfth aspect of the present disclosure, in the eleventh aspect, the $Mn^{4+}$-activated fluorine complex phosphor may be $K_2(Si_{1-h}Mn_h)F_6$.

In the foregoing structure, (i) the $Mn^{4+}$-activated fluorine complex phosphor has high emission intensity, (ii) the crystals of the $Mn^{4+}$-activated fluorine complex phosphor have high stability, and (iii) the $Mn^{4+}$-activated fluorine complex phosphor has high resistance to water.

Regarding a light-emitting device according to a thirteenth aspect of the present disclosure, in any of the first to tenth aspects, the $Mn^{4+}$-activated fluorine complex phosphor may be represented by general formula $MIII(MII_{1-h}Mn_h)F_6$, where MIII may contain at least one alkaline-earth metal element selected from Mg, Ca, Sr, and Ba, MII may contain at least one tetravalent metal element selected from Ge, Si, Sn, Ti, and Zr, and h may represent 0.001 or more and 0.1 or less.

In the foregoing structure, as with the eleventh aspect, the concentration of the $Mn^{4+}$ ions specified by h is an appropriate concentration. This enhances the emission intensity of the $Mn^{4+}$-activated fluorine complex phosphor.

Regarding a light-emitting device according to a fourteenth aspect of the present disclosure, in the thirteenth aspect, the $Mn^{4+}$-activated fluorine complex phosphor may be $Ba(Si_{1-h}Mn_h)F_6$.

In the foregoing structure, (i) the $Mn^{4+}$-activated fluorine complex phosphor has high luminous efficiency, (ii) the $Mn^{4+}$-activated fluorine complex phosphor is less likely to degrade by heat and an external force, and (iii) the $Mn^{4+}$-activated fluorine complex phosphor has high resistance to water.

Regarding a light-emitting device according to a fifteenth aspect of the present disclosure, in any of the first to fourteenth aspects, the blue light may have a peak wavelength of about 420 nm or more and about 480 nm or less.

In the foregoing structure, the luminous efficiency of the light-emitting element is increased to improve the luminous efficiency of the light-emitting device.

Regarding a light-emitting device according to a sixteenth aspect of the present disclosure, in the fifteenth aspect, the blue light may have a peak wavelength of about 440 nm or more and about 460 nm or less.

In the foregoing structure, the light-emitting element has particularly high luminous efficiency. Furthermore, the peak wavelength of the blue light is well matched to the excitation spectrum of the red phosphor and the transmission spectrum of the blue color filter. Thus, the light-emitting device has further improved luminous efficiency.

An image display apparatus (100) according to a seventeenth aspect of the present disclosure includes the light-emitting device according to any of the first to sixteenth aspects.

In the foregoing structure, the image display apparatus in which the luminous efficiency is less likely to decrease is provided.

The present disclosure is not limited to the foregoing embodiments. Various modifications can be made within the scope defined by the claims. Any embodiment based on an appropriate combination of technical means disclosed in different embodiments is also encompassed in the technical scope of the present disclosure. Furthermore, by combining the technical means disclosed in the embodiments together, a new technical feature may be provided.

Other Expression of Present Disclosure

The present disclosure may be expressed as described below.

A semiconductor light-emitting device according to an aspect of the present disclosure includes a light-emitting element configured to emit blue light, a $Mn^{4+}$-activated fluorine complex phosphor that is excited by the blue light to emit red light, and a quantum-dot phosphor that is excited by the blue light to emit green light, in which the $Mn^{4+}$-activated fluorine complex phosphor is dispersed in a first dispersion medium in which the light-emitting element is sealed, and the quantum-dot phosphor is dispersed in a second dispersion medium that is spatially separated from the first dispersion medium.

In the semiconductor light-emitting device according to an aspect of the present disclosure, an emission spectrum of the quantum-dot phosphor may have a peak wavelength of about 520 nm or more and about 540 nm or less.

In the semiconductor light-emitting device according to an aspect of the present disclosure, the emission spectrum of the quantum-dot phosphor may have a half width of about 25 nm or more, and an emission spectrum of the $Mn^{4+}$-activated fluorine complex phosphor may have a half width of about 10 nm or less.

In the semiconductor light-emitting device according to an aspect of the present disclosure, the first dispersion medium may be a transparent member composed of a methyl-based silicone resin material.

In the semiconductor light-emitting device according to an aspect of the present disclosure, the second dispersion medium may be composed of any of a phenyl-based silicone resin, an acrylic-based resin, and a silsesquioxane-based UV-curable resin.

In the semiconductor light-emitting device according to an aspect of the present disclosure, the quantum-dot phosphor may be composed of any of CdSe, CdS, and CdTe.

In the semiconductor light-emitting device according to an aspect of the present disclosure, the quantum-dot phosphor may be composed of any of InP, InN, AlInN, InGaN, AlGaInN, and CuInGaSe.

In the semiconductor light-emitting device according to an aspect of the present disclosure, the $Mn^{4+}$-activated fluorine complex phosphor may be $MI_2$ $(MII_{1-h}Mn_h)F_6$ (where MI represents at least one alkali metal element selected from the group consisting of Li, Na, K, Rb, and Cs, MII represents at least one tetravalent metal element selected from the group consisting of Ge, Si, Sn, Ti, and Zr, and $0.001 \leq h \leq 0.1$).

In the semiconductor light-emitting device according to an aspect of the present disclosure, the $Mn^{4+}$-activated fluorine complex phosphor may be $K_2$ $(Si_{1-h}Mn_h)F_6$ ($0.001 \leq h \leq 0.1$).

An image display apparatus according to an aspect of the present disclosure includes the semiconductor light-emitting device according to any of the aspects described above.

The present disclosure may be applied to a light-emitting device including a phosphor that converts excitation light into fluorescent light, and an image display apparatus including the light-emitting device.

The present disclosure contains subject matter related to that disclosed in Japanese Priority Patent Application JP 2015-106655 filed in the Japan Patent Office on May 26, 2015, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting device comprising:
a light-emitting element configured to emit blue light;
a first wavelength conversion member containing a $Mn^{4+}$-activated fluorine complex phosphor that is excited by the blue light to emit red light;
a second wavelength conversion member containing a quantum-dot phosphor that is excited by the blue light to emit green light;
a blocking layer located between the second wavelength conversion member and the first wavelength conversion member, such that an interface between the blocking layer and the second wavelength member faces the first wavelength conversion member; and
an empty space located between the blocking layer and the first wavelength conversion member; wherein
the first wavelength conversion member and the second wavelength conversion member are separated from each other by the blocking layer and the empty space;
the blue light is incident at an interface between the first wavelength conversion and the empty space; and
the interface between the first wavelength conversion and the empty space includes a surface of the first wavelength conversion member that is not optically plane.

2. The light-emitting device according to claim 1, wherein a distance between the light-emitting element and the second wavelength conversion member is larger than a distance between the light-emitting element and the first wavelength conversion member.

3. The light-emitting device according to claim 1, wherein the light-emitting element is sealed in the first wavelength conversion member.

4. The light-emitting device according to claim 1, wherein an emission spectrum of the quantum-dot phosphor has a peak wavelength of 520 nm or more and 540 nm or less.

5. The light-emitting device according to claim 1, wherein an emission spectrum of the quantum-dot phosphor has a half width of 25 nm or more.

6. The light-emitting device according to claim 1, wherein an emission spectrum of the $Mn^{4+}$-activated fluorine complex phosphor has a half width of 10 nm or less.

7. The light-emitting device according to claim 1, wherein the first wavelength conversion member includes:
a dispersion medium,
wherein the $Mn^{4+}$-activated fluorine complex phosphor is dispersed in the dispersion medium, and the dispersion medium contains any of a methyl-based silicone resin, a phenyl-based silicone resin, an epoxy-based resin, an acrylic-based resin, and a silsesquioxane-based UV-curable resin.

8. The light-emitting device according to claim 7, wherein in the first wavelength conversion member, the dispersion medium in which the Mn$^{4+}$-activated fluorine complex phosphor is dispersed contains the methyl-based silicone resin.

9. The light-emitting device according to claim 1, wherein the second wavelength conversion member includes:
a dispersion medium,
wherein the quantum-dot phosphor is dispersed in the dispersion medium, and
the dispersion medium contains any of a phenyl-based silicone resin, an acrylic-based resin, and a silsesquioxane-based UV-curable resin.

10. The light-emitting device according to claim 9, wherein in the second wavelength conversion member, the dispersion medium in which the quantum-dot phosphor is dispersed contains the acrylic-based resin.

11. The light-emitting device according to claim 1, wherein the quantum-dot phosphor is composed of any of CdSe, CdS, CdTe, InP, InN, AlInN, InGaN, AlGaInN, and CuInGaSe.

12. The light-emitting device according to claim 1, wherein the Mn$^{4+}$-activated fluorine complex phosphor is represented by the following general formula:

$$MI_2(MII_{1-h}Mn_h)F_6$$

where MI contains at least one alkali metal element selected from Li, Na, K, Rb, and Cs,
MII contains at least one tetravalent metal element selected from Ge, Si, Sn, Ti, and Zr, and
h represents 0.001 or more and 0.1 or less.

13. The light-emitting device according to claim 12, wherein the Mn$^{4+}$-activated fluorine complex phosphor is $K_2(Si_{1-h}Mn_h)F_6$.

14. The light-emitting device according to claim 1, wherein the Mn$^{4+}$-activated fluorine complex phosphor is represented by the following general formula:

$$MIII(MII_{1-h}Mn_h)F_6$$

where MIII contains at least one alkaline-earth metal element selected from Mg, Ca, Sr, and Ba,
MII contains at least one tetravalent metal element selected from Ge, Si, Sn, Ti, and Zr, and
h represents 0.001 or more and 0.1 or less.

15. The light-emitting device according to claim 14, wherein the Mn$^{4+}$-activated fluorine complex phosphor is $Ba(Si_{1-h}Mn_h)F_6$.

16. The light-emitting device according to claim 1, wherein the blue light has a peak wavelength of 420 nm or more and 480 nm or less.

17. The light-emitting device according to claim 16, wherein the blue light has a peak wavelength of 440 nm or more and 460 nm or less.

18. An image display apparatus comprising:
the light-emitting device according to claim 1.

* * * * *